United States Patent
Shimizu

(12) 
(10) Patent No.: US 6,455,410 B2
(45) Date of Patent: Sep. 24, 2002

(54) SEMICONDUCTOR DEVICE AND METHOD OF MANUFACTURING THE SAME

(75) Inventor: Masahiro Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/779,629

(22) Filed: Feb. 9, 2001

(30) Foreign Application Priority Data

Aug. 10, 2000 (JP) ........................................ 2000-242287

(51) Int. Cl.⁷ .......................................... H01L 21/4763
(52) U.S. Cl. ........................ 438/622; 438/624; 438/637; 438/640
(58) Field of Search ................................. 257/752, 758, 257/760, 774; 438/622, 624, 637, 638, 640, 673

(56) References Cited

U.S. PATENT DOCUMENTS

| | | | | |
|---|---|---|---|---|
| 4,946,804 A | * | 8/1990 | Pritchard et al. | 428/637 |
| 5,026,666 A | * | 6/1991 | Hills et al. | 438/637 |
| 5,453,403 A | * | 9/1995 | Meng et al. | 438/640 |
| 5,629,237 A | * | 5/1997 | Wang et al. | 438/701 |
| 5,821,164 A | * | 10/1998 | Kim et al. | 438/633 |
| 5,841,196 A | * | 11/1998 | Gupta et al. | 257/774 |
| 5,888,887 A | * | 3/1999 | Li et al. | 438/525 |
| 5,930,672 A | * | 7/1999 | Yamamoto | 438/637 |
| 6,300,683 B1 | * | 10/2001 | Nagasaka et al. | 257/774 |

FOREIGN PATENT DOCUMENTS

JP          8-203999          8/1996

* cited by examiner

Primary Examiner—T. N. Quach
(74) Attorney, Agent, or Firm—McDermott, Will & Emery

(57) ABSTRACT

A semiconductor device and a method of manufacturing thereof are provided wherein no hollow area is generated in a contact wiring plug which is formed in the interlayer insulation layer. According to the method of manufacturing of this semiconductor device, a contact wiring plug 13 of a two layered structure of a barrier metal layer and a tungsten layer is formed by using a spattering method or the like. At this time, since the recessed part 10a has a shape which gradually spreads to the outside to a greater degree in relation to the closeness to the upper surface, the formation of the contact wiring plug 13 is carried out under excellent covering conditions. As a result, a semiconductor device wherein no hollow area is generated in the contact wiring plug, which is formed in the interlayer insulation layer, can be gained.

4 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing therefore, in particular to a method of manufacturing for a semiconductor device which comprises a wiring structure having contact holes with a large aspect ratio.

2. Description of the Background Art

In recent years the demand for semiconductor devices has been rapidly expanding due to the remarkable spread of information apparatuses such as computers. In addition, semiconductor devices which have a large scale memory capacity and enable high speed operation with respect to function are in high demand. Together with this, a technology relating to a higher integration of semiconductor devices has been developed.

In the following a method of manufacturing for a semiconductor device having a conventional wiring structure is described in reference to FIGS. 14 to 17. As shown in FIG. 14 insulation oxide film 5 and 6 are formed on the main surface of a p-type silicon substrate 1, which is a semiconductor substrate. A channel region 3 is formed in an active region defined by the insulation oxide film 5 and 6. A source/drain region 4 is formed in a region in the vicinity of the surface of the channel region 3. A channel cut impurity region 2 is provided in the lower layer below the channel region 3 and the insulation oxide film 5 and 6 for the purpose of optimizing the impurity concentration of a region beneath the insulation oxide film 5 and 6 so as to increase the insulation characteristics.

An interlayer insulation layer 7 with a three layered structure is formed on the surface of the p-type silicon substrate 1. This interlayer insulation layer 7 is formed of the first interlayer insulation layer 7a comprising a TEOS (Tetra Etyle Ortho Silicate) layer, the second interlayer insulation layer 7b comprising a BPSG (Borospho Silicate Glass) layer and the third interlayer insulation layer 7c comprising a TEOS layer.

A resist film 8 which has a predetermined aperture pattern is formed on the upper surface of the interlayer insulation layer 7 and a contact hole 10 is formed by using this resist film 8 as a mask for carrying out the etching of the interlayer insulation layer 7.

Next, as shown in FIG. 15, a contact wiring plug 13 with a two layered structure of a barrier metal layer having TiN or TiN/Ti and a tungsten layer is formed after the resist film 8 is removed. After that, as shown in FIG. 16, the contact wiring plug 13 which has been formed in the interlayer insulation layer 7 is removed through an etch back method or a CMP (Chemical Mechanical Polishing) method.

Next, as shown in FIG. 17, a wiring layer 14 which is connected to the contact wiring plug 13, and which comprises aluminum or the like in a predetermined form, is formed on the upper surface of the interlayer insulation layer 7. As described above the source/drain region 4 and the wiring layer 14 are electrically connected by the contact wiring plug 13 provided in the contact hole 10 of the interlayer insulation layer 7.

In the above described method of manufacturing for a semiconductor device, however, the problems as shown below arise.

First, as described above, a three layered structure of the first interlayer insulation layer 7a comprising a TEOS, the second interlayer insulation layer 7b comprising a BPSG and the third interlayer insulation layer 7c comprising a TEOS is adopted for the interlayer insulation layer 7.

The reason why the first interlayer insulation layer 7a comprising a TEOS is formed on the p-type silicon substrate 1 is that, in the case that a BPSG is used for the second interlayer insulation layer 7b which is the middle layer, the impurity which has been doped in this BPSG must be prevented from diffusing into the p-type silicon substrate 1.

The reason why a BPSG is formed for the second interlayer insulation layer 7b is that it is preferable to utilize a material which is rich in fluidity at the time of heat method of manufacturinging order to increase the filling characteristics of the interlayer insulation layer 7, which is of a three layered structure, and the BPSG has this characteristic.

The reason why a TEOS is formed for the third interlayer insulation layer 7c is to increase the tightness of the contact with the resist film.

As a result of the adoption, because of the above described reasons as shown in FIG. 14, of the three layered structure for the interlayer insulation layer 7 the second interlayer insulation layer 7b is etched larger than the first interlayer insulation layer 7a and the third interlayer insulation layer 7c at the time of the etching for forming the contact hole 10 due to the difference of the etching rates of the BPSG and the TEOS, which are their etching characteristics and, therefore, a recessed part 10a, wherein the side walls are recessed inwardly, is formed on the side walls of the contact hole 10.

In the case that the contact wiring plug 13 is formed under the condition where the recessed part 10a on the side walls of the contact hole 10 is formed, as shown in FIG. 15, a hollow area 13a is formed in the contact wiring plug 13. In the case that a wiring layer 14 is formed under the condition where the hollow area 13a is formed in the contact wiring plug 13, as shown in FIG. 17 no problem arises when a wiring layer 14 is formed in a predetermined position of the third interlayer insulation layer 7c.

As shown in FIG. 18, however, in the case that the first interlayer insulation layer 7a and the second interlayer insulation layer 7b are removed through etching to a stage where the hollow area 13a is exposed in the method of manufacturing for a semiconductor device in conjunction with the peripheral circuits, there are some cases wherein slurry or the like is collected in the hollow area 13a, of which the upper part is open, so as to negatively influence the conductive characteristics of the contact wiring plug 13.

In addition, as shown in FIG. 19, in the case that the wiring layer 14 is formed on the area which has been shifted above the contact wiring plug 13, the hollow area 13a is exposed and the etching wet liquid used for the washing process after forming the wiring layer 14 is collected in the hollow area 13a so that there is the danger that the wiring area 14 comprising aluminum or the like may be corroded.

SUMMARY OF THE INVENTION

The purpose of this invention is to provide a semiconductor device which will not generate the hollow area in the contact wiring plug formed in the interlayer insulation layer, as well as the method of manufacturing therefore.

The method of manufacturing a semiconductor device according to this invention comprises: the step of the formation of a first conductive region for forming a first conductive region; the step of the formation of an interlayer insulation layer for forming an interlayer insulation layer on said first conductive region; the step of the opening of a contact hole for opening a contact hole which has a recessed region wherein the side walls are recessed in the middle area and which pierces through said interlayer insulation layer and reaches said first conductive region; the step of the formation of a resist film for forming a resist film within said contact hole and on the upper surface of said interlayer insulation layer; the step of the exposure of the recessed region for removing said resist film and part of said interlayer insulation layer located on the upper surface of said interlayer insulation layer so that said recessed region within said contact hole is exposed; the step of the removal of the resist film for removing said resist film of which the residue remains within said second contact hole; the step of the formation of a wiring plug for forming a wiring plug within said contact hole; and the step of the formation of a second wiring region for forming a second wiring region connected to said wiring plug on the upper surface of said interlayer insulation layer.

According to this method of manufacturing no recessed part exists on the side walls of the contact hole in the middle area, as in a conventional structure and, therefore, the recessed part of the side walls is located in the aperture area of the upper end part of the contact hole. Thereby, the contact wiring plug is formed so as to be completely filled in inside of the contact hole in the wiring plug formation method of manufacturing so as not, unlike in the conventional structure, to form a hollow area in the wiring plug. As a result, the generation of a slurry pool at the time of the CMP or the generation of an etching wet liquid pool in the case that the second wiring region is shifted when being formed are not caused and, therefore, it becomes possible to increase the reliability of the wiring structure of the semiconductor device.

In the above described invention moreover, it is preferable for the above described step of the exposure of the recessed region to include, after the step of the removal of said resist film and part of said interlayer insulation layer located on the upper surface of said interlayer insulation layer: the step of the removal of the upper surface of said resist film, of which the residue remains within said contact hole, so as to be lower by a predetermined distance than the upper surface of said interlayer insulation layer; and the step of the removal of the corner parts of said interlayer insulation layer which forms an aperture part of said exposed contact hole.

According to this method of manufacturing, the contact hole becomes cone shaped, of which the aperture part of the upper end part is widened to the outside so that coverage of the contact hole in the step of wiring plug formation is improved and it becomes possible to prevent the wiring plug from being peeled off.

In the above described invention moreover, it is preferable for the above described step of the removal of the resist film includes the step of applying heat processing to said interlayer insulation layer in order to round off the corner parts of said interlayer insulation layer which forms an aperture part of said exposed contact hole after the residue of said resist film which has remained within said contact hole is removed.

According to this method of manufacturing the contact hole also becomes cone shaped, of which the aperture part of the upper end part is widened to the outside so that coverage of the contact hole in the step of wiring plug formation is improved and it becomes possible to prevent the wiring plug from being peeled off.

In the above described invention moreover, it is preferable that the above described step of the formation of said interlayer insulation layer has: the step of the formation of a first interlayer insulation layer for forming a first interlayer insulation layer on said first conductive region; the step of the formation of a second interlayer insulation layer for forming a second interlayer insulation layer, of which the etching characteristic is different from that of said first interlayer insulation layer, on said first interlayer insulation layer; and the step of the formation of a third interlayer insulation layer for forming a third interlayer insulation layer, which has the same etching characteristic as said first interlayer insulation layer, on said second interlayer insulation layer, while said step of the formation of the first interlayer insulation layer and said step of the formation of the third interlayer insulation layer include the step of forming a TEOS film, said step of the formation of the second interlayer insulation layer includes the step of forming a BPSG film, and said recessed region is formed in said second interlayer insulation layer.

A semiconductor device according to this invention comprises: a first conductive region; an interlayer insulation provided on said first conductive region; an interlayer insulation provided on said interlayer insulation layer; a wiring plug which is provided within a contact hole piercing through said interlayer insulation layer and which is electrically connected to said first conductive region; and a second conductive region which is provided on the upper surface of said interlayer insulation layer and which is electrically connected to the wiring plug, wherein the inner walls in the vicinity of the upper end part of said contact hole has a shape which gradually spreads to the outside to a greater degree in relation to the closeness to the upper surface.

According to this semiconductor device, no recessed part, as in a conventional structure, of the side walls exists in the middle area of the contact hole. Thereby, the contact wiring plug is formed so as to be completely filled in inside of the contact hole so that no hollow area is formed, unlike in the conventional structure, in the contact wiring plug. As a result, the generation of a slurry pool at the time of CMP and the generation of the etching wet liquid pool in the case that the second wiring region is shifted when being formed will not occur and it becomes possible to increase the reliability of the wiring structure of a semiconductor device. In addition, it becomes possible to increase the reliability of the wiring structure of a semiconductor device by expanding the contact area with the second wiring region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a method of manufacturing a semiconductor device according to each of the embodiments based on the present invention is described in reference to the drawings.

First Embodiment
Process and Wiring Structure

In reference to FIGS. 1 to 6 a method of manufacturing a semiconductor device according to the present embodiment is described. Here, FIGS. 1 to 6 are cross section views showing each step of the method of manufacturing gaining a wiring structure used for a DRAM (Dynamic Random Access Memory) as an example of a semiconductor device.

Figure 1:
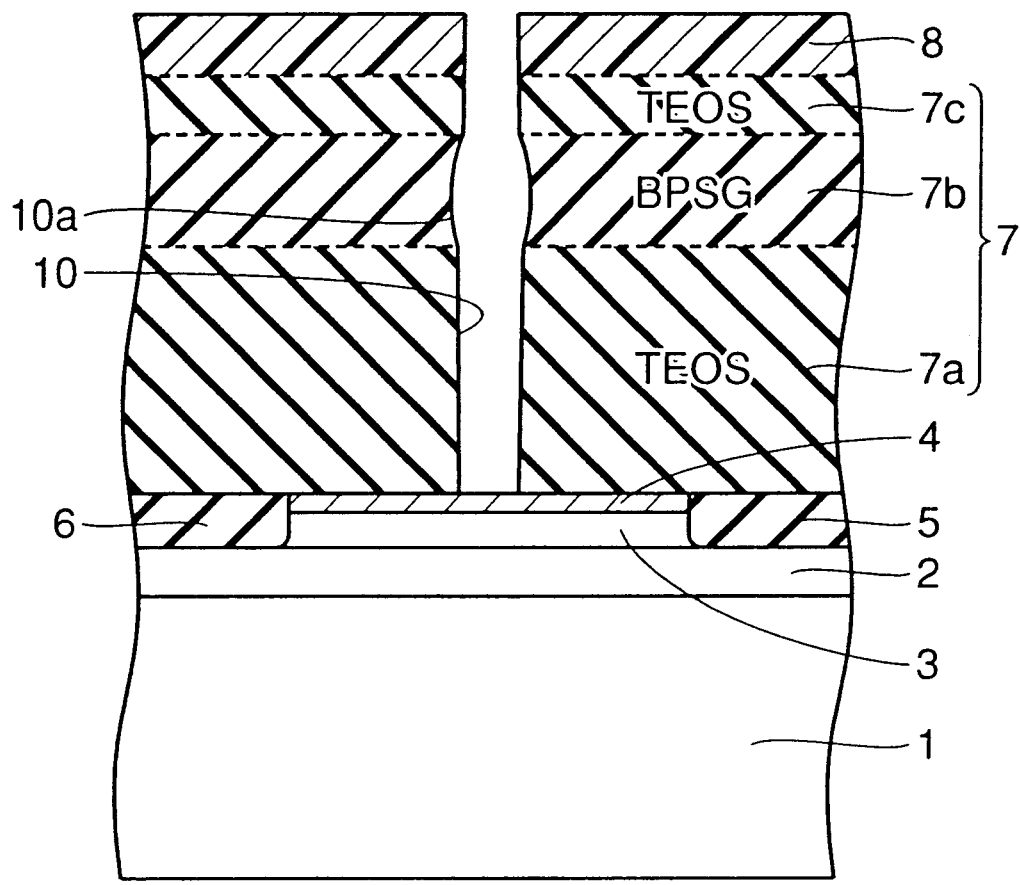
FIG. 1 is a cross section view showing one step of a method of manufacturing a semiconductor device according to the first to third embodiments.

As shown in FIG. 1 insulation oxide film 5, 6 is formed on the main surface of a p-type silicon substrate 1 which is a semiconductor substrate. A channel region 3 is formed in an active area defined by the insulation oxide film 5, 6. A source/drain region 4 is formed in the region in the vicinity of the surface of the channel region 3 as the first conductive region. A channel cut impurity region 2 is provided in lower layers of the channel region 3 and insulation oxide film 5, 6 for the purpose of increasing insulation characteristics by optimizing the impurity concentration in the region below the insulation oxide film 5, 6.

An interlayer insulation layer 7 of the three layered structure is formed on the surface of the p-type silicon substrate 1. This interlayer insulation layer 7 is formed of the first interlayer insulation layer 7a comprising a TEOS layer, the second interlayer insulation layer 7b comprising a BPSG layer and the third interlayer insulation layer 7c comprising a TEOS layer.

The first interlayer insulation layer 7a is formed of the film thickness of 0.1 $\mu$m to 0.5 $\mu$m, the second interlayer insulation layer 7b is formed of the film thickness of 0.3 $\mu$m to 2.0 $\mu$m and the third interlayer insulation layer 7c is formed of the film thickness of 0.05 $\mu$m to 0.3 $\mu$m.

A resist film 8 which has a predetermined aperture pattern is formed on the upper surface of the interlayer insulation layer 7 and by using this resist film 8 as a mask the interlayer insulation layer 7 is etched to form a contact hole 10. In the present embodiment a three layered structure is adopted for the interlayer insulation layer 7, because of the same reason as for a prior art, and a recessed part 10a is formed in the side walls of the contact hole 10 in the area of the second interlayer insulation layer 7b.

Figure 2:
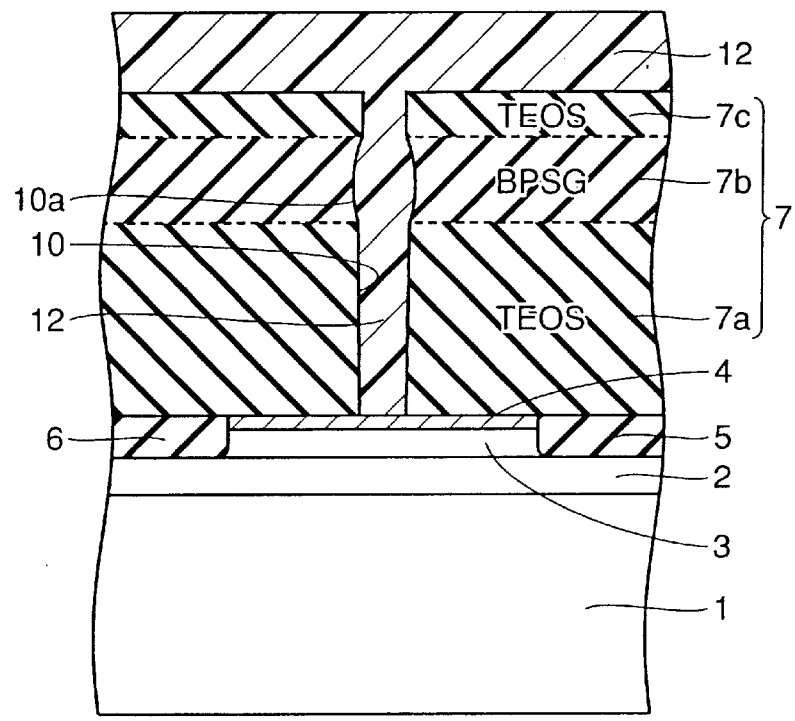
FIG. 2 is a cross section view showing the step carried out after the step as shown in FIG. 1 in the first to third embodiments.
Figure 3:
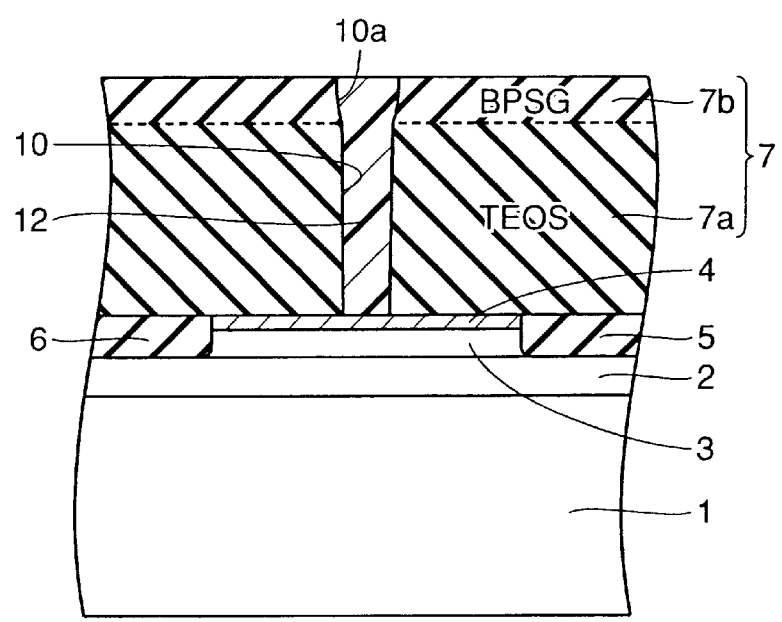
FIG. 3 is a cross section view showing the step carried out after the step as shown in FIG. 2 in the first to third embodiments.

Next, as shown in FIG. 2, a resist film 12 is formed on the upper surface of the third interlayer insulation layer 7c so as to be filled in in the contact hole 10 after the resist film 8 is removed. After that, as shown in FIG. 3, the resist film 12, the third interlayer insulation layer 7c and part of the second interlayer insulation layer 7b are removed so as to reach the recessed part 10a by using a CMP method using silica slurry, a plasma etching method or the like.

Figure 4:
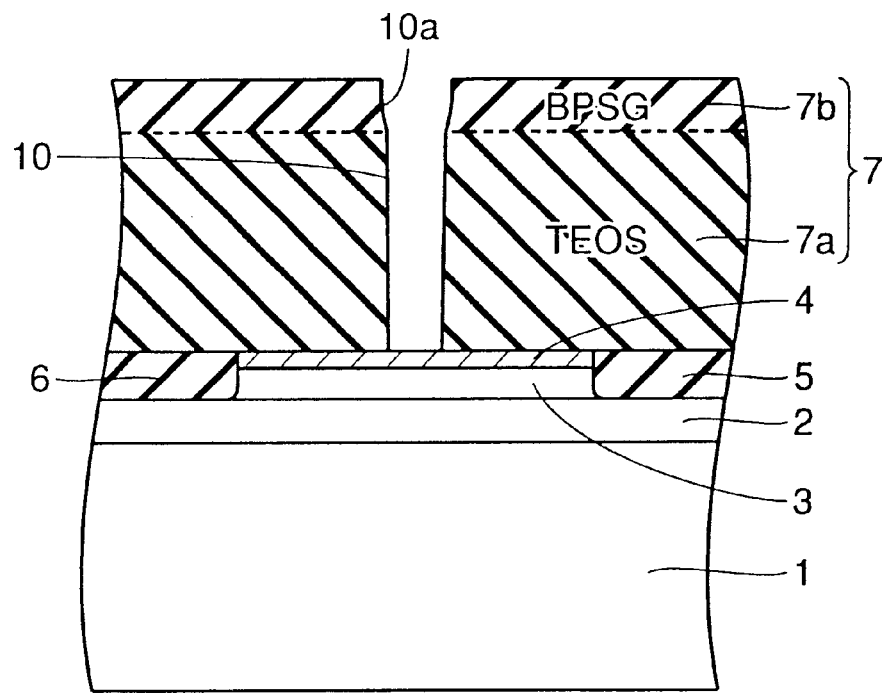
FIG. 4 is a cross section view showing the step carried out after the step as shown in FIG. 3 in the first to third embodiments.

After that, as shown in FIG. 4, only the resist film 12 within the contact hole 10 is removed. Thereby, the upper part of the recessed part 10a is removed in the area of the second interlayer insulation layer 7b of the contact hole 10 and, as a result, the recessed part 10a remains in a shape which gradually spreads to the outside to a greater degree in relation to the closeness to the upper surface.

Figure 5:
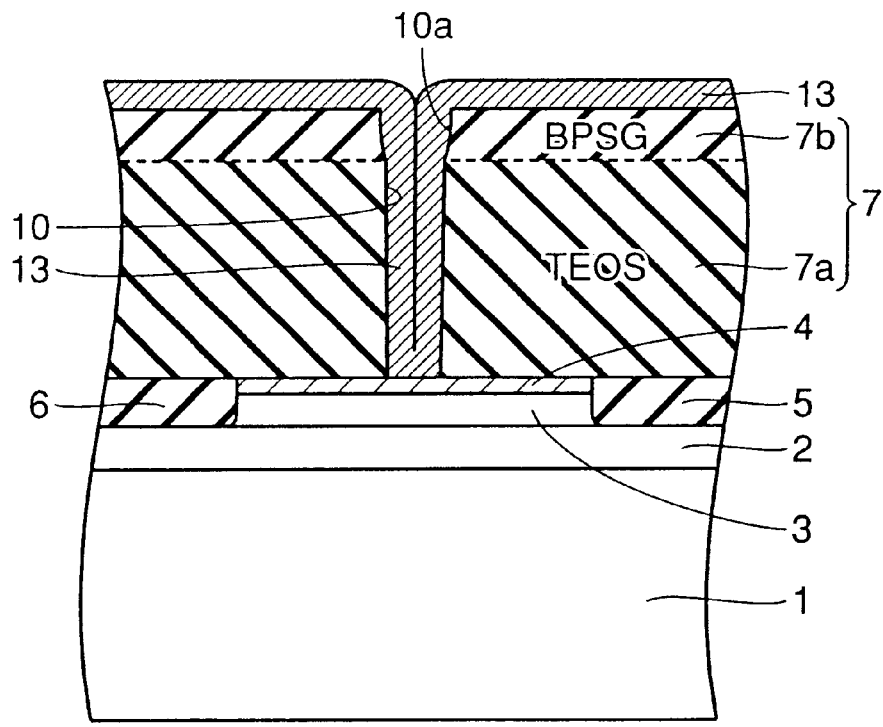
FIG. 5 is a cross section view showing the step carried out after the step as shown in FIG. 4 in the first and third embodiments.

Next, as shown in FIG. 5, a contact wiring plug 13 of a two layered structure of a barrier metal layer having TiN or TiN/Ti and a tungsten layer is formed on the upper surface of the second interlayer insulation layer 7b, and within the contact hole 10, using a spattering method or the like. At this time, since the recessed part 10a has a shape which gradually spreads to the outside to a greater degree in relation to the closeness to the upper surface, the formation of the contact wiring plug 13 is carried out under excellent covering conditions.

As for the ratio between the barrier metal layer and the tungsten layer of the contact wiring plug 13, in the case that TiN is used for the barrier metal layer [W/TiN]=[0.2 $\mu$m to 0.5 $\mu$m/0.01 $\mu$m to 0.08 $\mu$m] and in the case that TiN/Ti is used for the barrier metal layer [W/TiN/Ti]=[0.2 $\mu$m to 0.5 $\mu$m/0.02 $\mu$m to 0.08 $\mu$m/0.01 $\mu$m to 0.05 $\mu$m].

Figure 6:
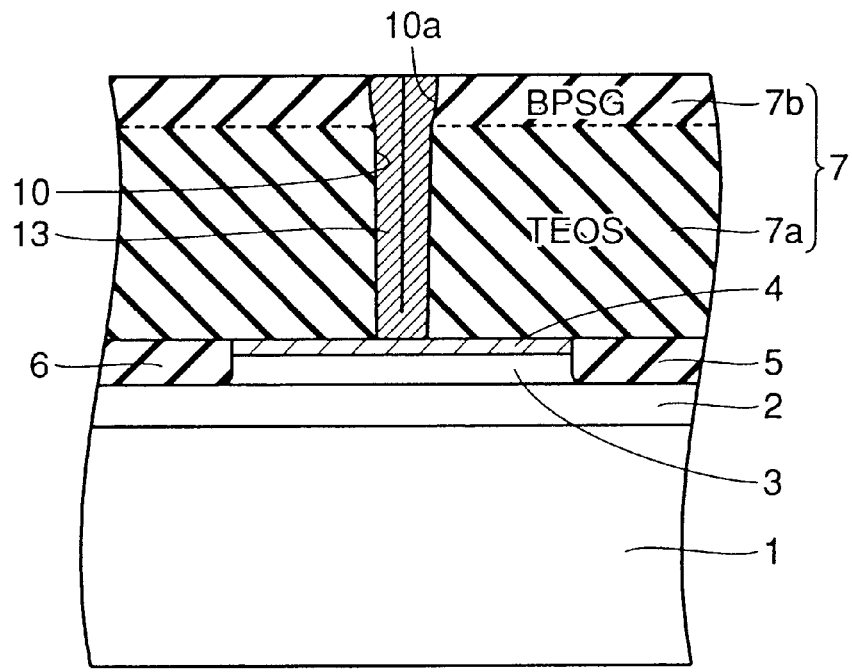
FIG. 6 is a cross section view showing the step carried out after the step as shown in FIG. 5 in the first and third embodiments.

Next, as shown in FIG. 6, the contact wiring plug 13 which has been formed on the upper surface of the second interlayer insulation layer 7b is removed by an etch back method using SF6 or a CMP method using silica slurry in a hydrogen peroxide solution.

Figure 7:
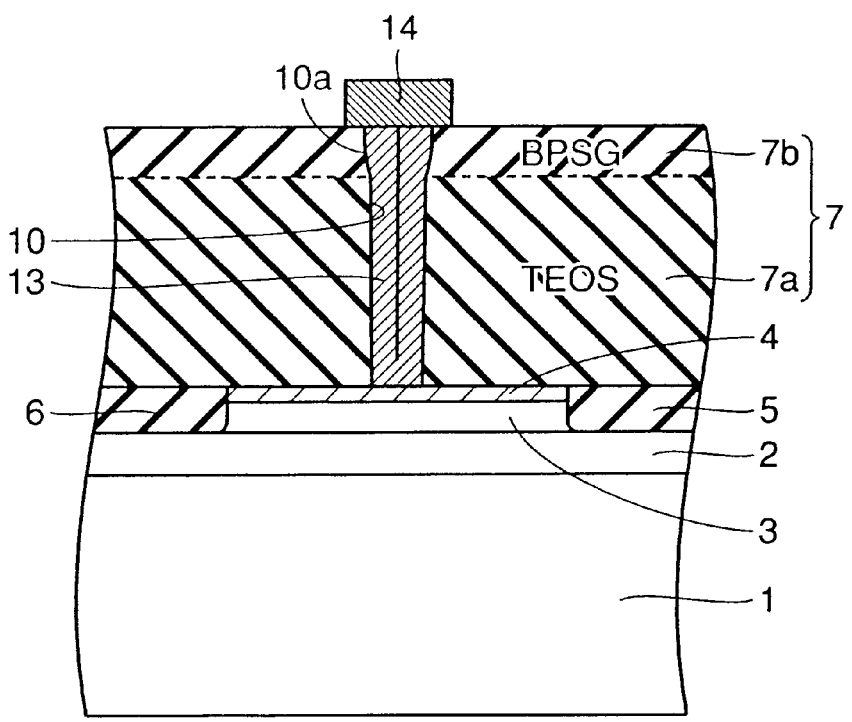
FIG. 7 is a cross section view showing the step carried out after the step as shown in FIG. 6 in the first and third embodiments.

Next, as shown in FIG. 7, a wiring layer 14, which is connected to the contact wiring plug 13, is formed on the upper surface of the interlayer insulation layer 7 as the second wiring region comprising aluminum of a predetermined form.

Through the above steps a wiring structure of a DRAM where the source/drain region 4 and the wiring layer 14 are electrically connected through the contact wiring plug 13 provided in the contact hole 10 in the interlayer insulation layer 7 can be gained.

Here, as described above, the second interlayer insulation layer 7b is not removed to the extent to entirely eliminate the recessed part 10a, instead the upper half of the second interlayer insulation layer 7b is removed because, in the case of the wiring structure used for a DRAM, the disadvantages where the memory cell pattern provided in the periphery is exposed may occur.

In addition, in the case that the contact hole 10 is designed under a presupposition that the second interlayer insulation layer 7b is removed so that the recessed part 10a is entirely eliminated including the case of a logic device, the depth of the contact hole 10 becomes great and it becomes difficult to form the contact hole 10 according to the design value.

Operation and Working Effect

According to a method of manufacturing and a wiring structure based on this embodiment, the recessed part 10a does not, unlike in a conventional structure, exist in the side walls of the middle area of the contact hole 10, rather, the recessed part 10a is located in the side walls of an aperture area of the upper end part of the contact hole 10. Thereby, in the step of formation of the contact wiring plug 13, the contact wiring plug 13 is formed so as to be completely filled in inside of the contact hole and, therefore, no hollow area is formed, as in a conventional structure, in the contact wiring plug.

As a result, no slurry pool is generated at the time of CMP and no etching wet liquid pool is generated in the case that the wiring layer 14 is formed in a shifted position and, therefore, it becomes possible to increase the reliability of the wiring structure of a DRAM.

Second Embodiment

Process

A method of manufacturing a semiconductor device according to the present embodiment is described in reference to FIGS. 1 to 3 and FIGS. 8 to 12. Here, in the same way as in the case of the above described first embodiment, FIGS. 8 to 12 are cross section views showing each step of a method of manufacturing gaining a wiring structure used for a DRAM as an example of a semiconductor device.

Figure 8:
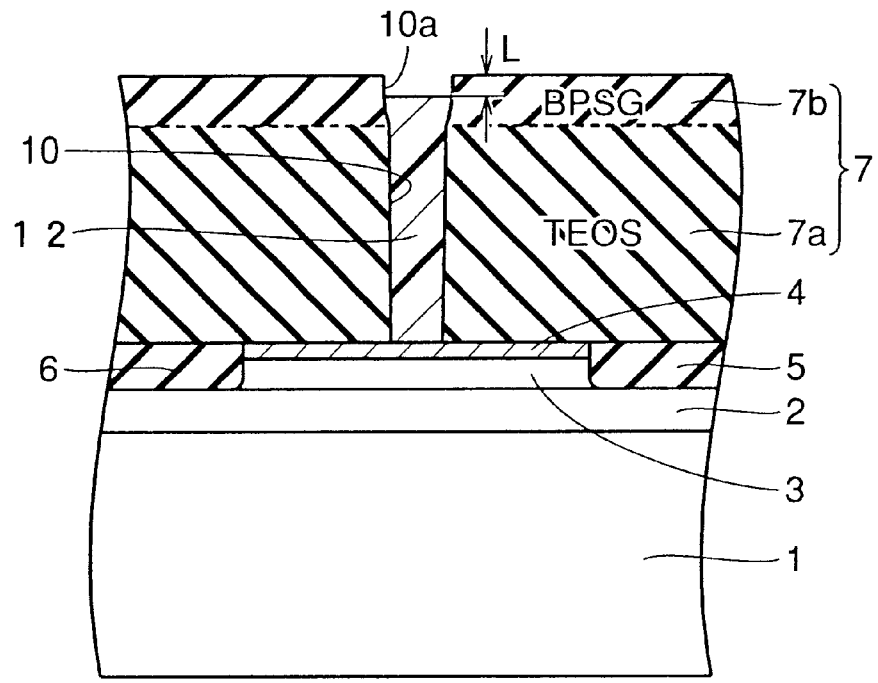
FIG. 8 is a cross section view showing the step carried out after the step as shown in FIG. 4 in the second embodiment.
Figure 9:
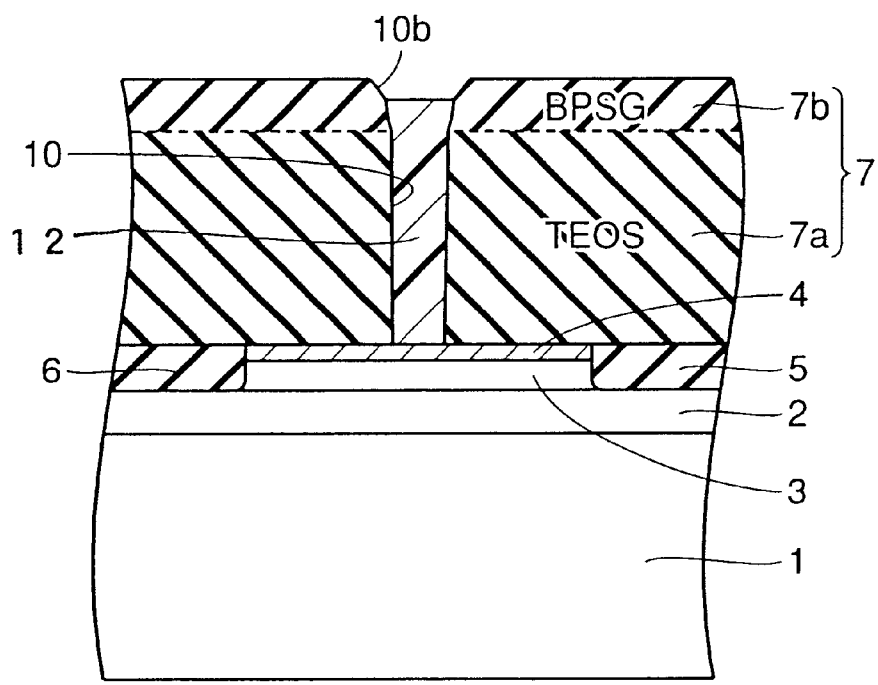
FIG. 9 is a cross section view showing the step carried out after the step as shown in FIG. 8 in the second embodiment.

The steps as shown in FIGS. 1 to 3 pass through the same steps as in the above described first embodiment, of which the detailed description is omitted here. Next, as shown in FIG. 8, the resist film 12 within the contact hole 10 is removed through etching the distance L (0.01 $\mu$m to 0.3 $\mu$m) from the upper surface of the second interlayer insulation layer 7b. After that, the corner parts of the contact hole 10 are removed by using a spatter etch method or a dry etch method and, thereby, as shown in FIG. 9, the corner parts of the aperture part of the contact hole 10 are spread further to the outside than in the first embodiment to form a cone shape 10b.

Figure 10:
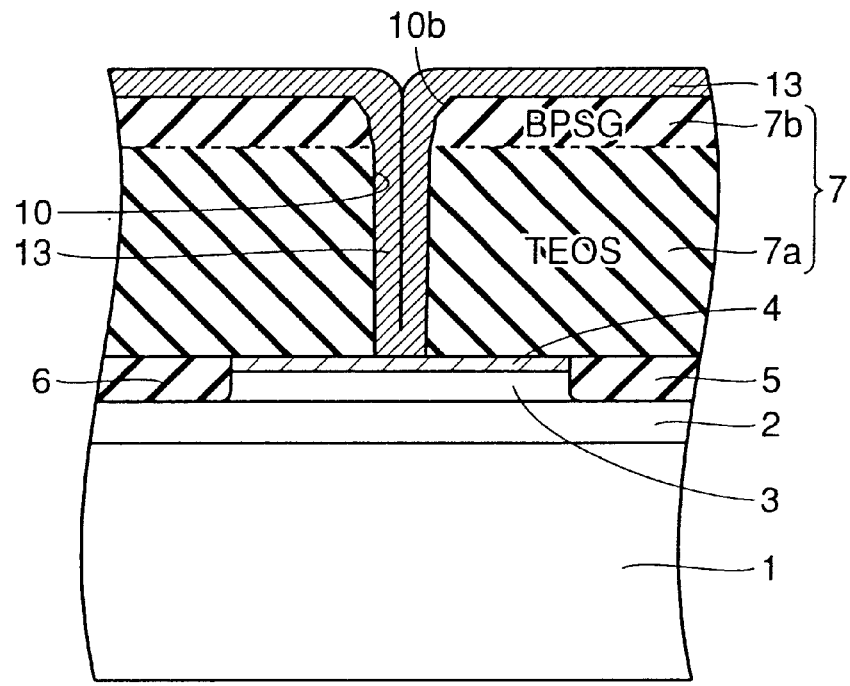
FIG. 10 is a cross section view showing the step carried out after the step as shown in FIG. 9 in the second embodiment.

Next, as shown in FIG. 10, a contact wiring plug 13 of a two layered structure of a barrier metal layer having TiN or TiN/Ti and a tungsten layer is formed on the upper surface of the second interlayer insulation layer 7b as well as inside of the contact hole 10 by using a spattering method or the like. The ratio between the barrier metal layer and the tungsten layer is similar to that in the above described first embodiment.

Figure 11:
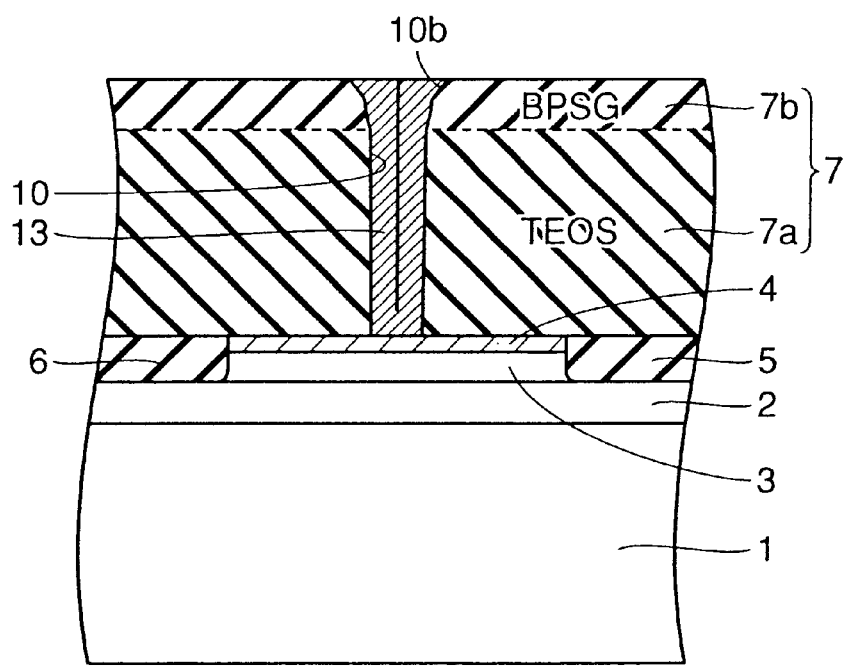
FIG. 11 is a cross section view showing the step carried out after the step as shown in FIG. 10 in the second embodiment.
Figure 12:
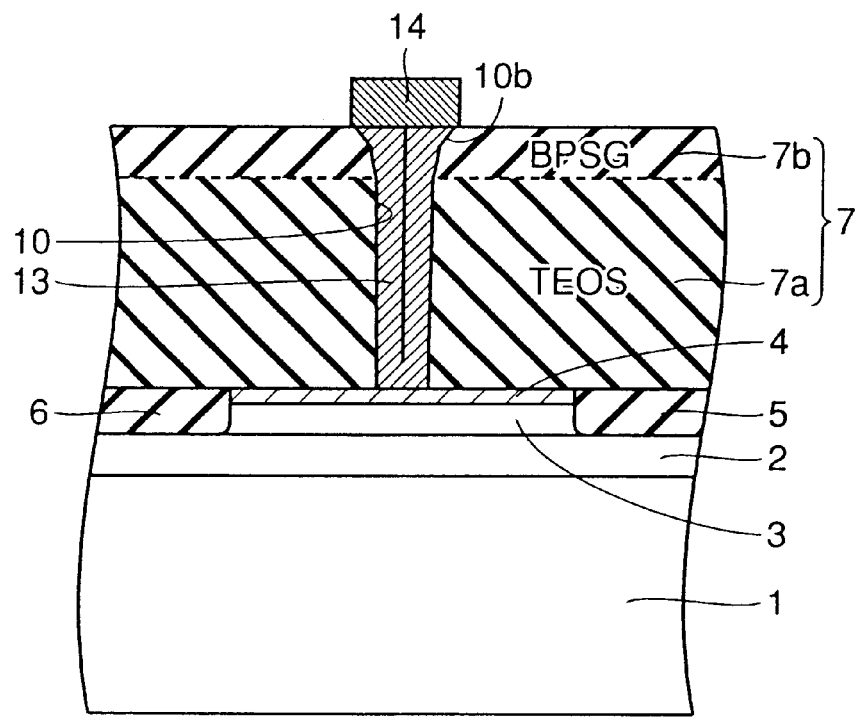
FIG. 12 is a cross section view showing the step carried out after the step as shown in FIG. 11 in the second embodiment.

Next, as shown in FIG. 11, the contact wiring plug 13, which has been formed on the upper surface of the second interlayer insulation layer 7b, is removed by an etch back method using SF6, or a CMP method using silica slurry in hydrogen peroxide solution. After that, as shown in FIG. 12, a wiring layer 14 which is connected to the contact wiring plug 13, and which comprises aluminum or the like in a predetermined form, is formed on the upper surface of the interlayer insulation layer 7.

Through the above steps, a wiring structure of a DRAM, wherein the source/drain region 4 and the wiring layer 14 are electrically connected through the contact wiring plug 13 provided in the contact hole 10 in the interlayer insulation layer 7, can be gained.

Operation and Working Effect

According to a method of manufacturing and a wiring structure based on this embodiment, the same operation and working effect as in the above described first embodiment can be gained and it also becomes possible to improve the coverage of the contact wiring plug 13 for the contact hole 10 and to control the peeling of the contact wiring plug 13 by making the aperture part of the contact hole 10 into a cone shape 10b. In addition, it becomes possible to increase the reliability of the wiring structure of a DRAM by expanding the contact area with the wiring layer 14 of the contact wiring plug 13.

Third Embodiment

Process

A method of manufacturing a semiconductor device according to the present embodiment is described in reference to FIGS. 1 to 6 and FIG. 13. Here, FIGS. 1 to 6 and FIG. 13 are cross section views showing each step of a method of manufacturing gaining a wiring structure used for a DRAM as an example of a semiconductor device in the same way as in the above described first embodiment.

The method of manufacturing in the present embodiment is basically the same as the method of manufacturing of the first embodiment as shown in FIGS. 1 to 6 except for a different point which is an additional heat processing step after the removal of the resist film 12 of which the residue remains within the contact hole 10 as shown in FIG. 4. The purpose of this heat processing is, in the same way as in the above described second embodiment, to make the aperture part of the contact hole 10 be in a cone shape 10b. The conditions for this heat processing are 700° C. to 800° C. and approximately 30 minutes.

Figure 13:
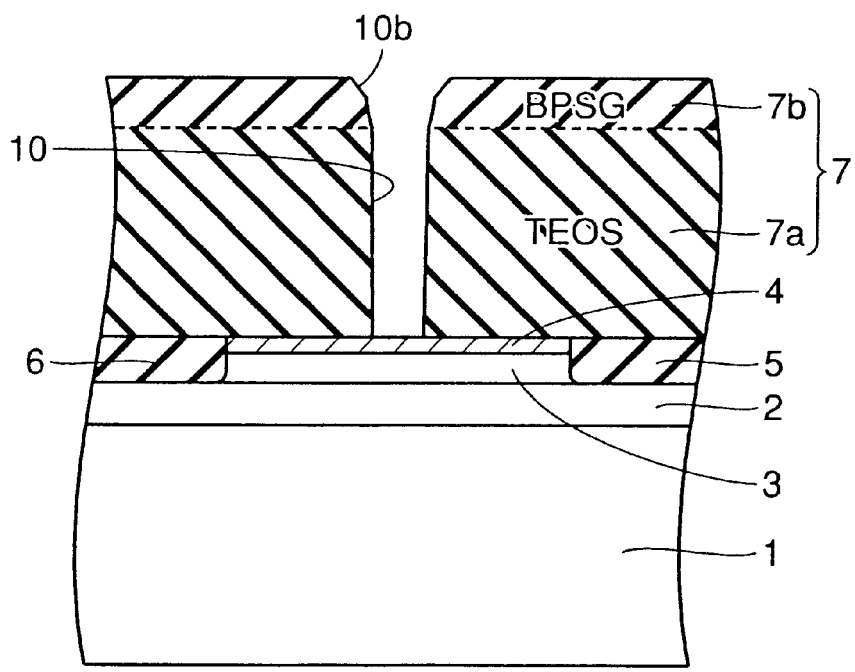
FIG. 13 is a cross section view showing the step carried out after the step as shown in FIG. 4 in the third embodiment.
Figure 14:
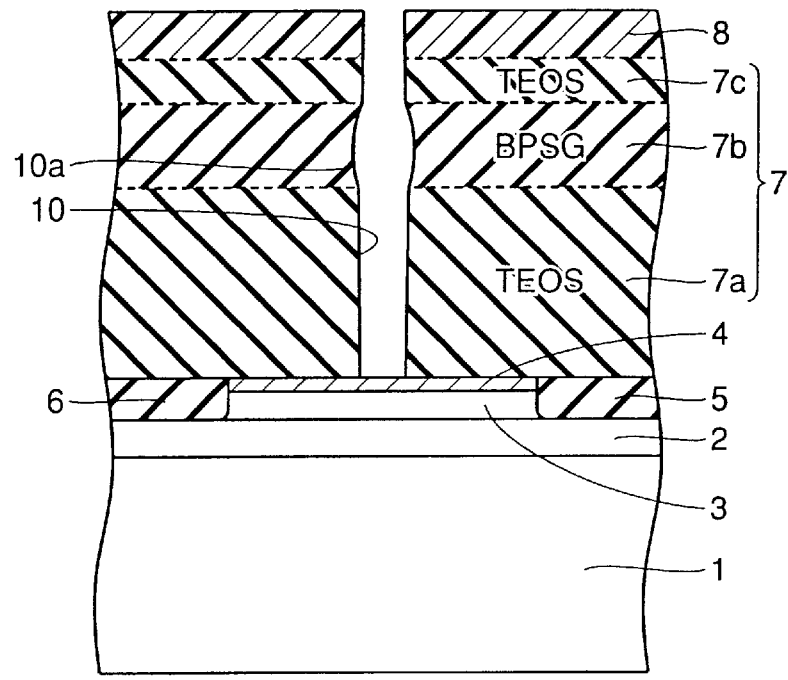
FIG. 14 is a cross section view showing the step of a method of manufacturing a semiconductor device according to a prior art.
Figure 15:
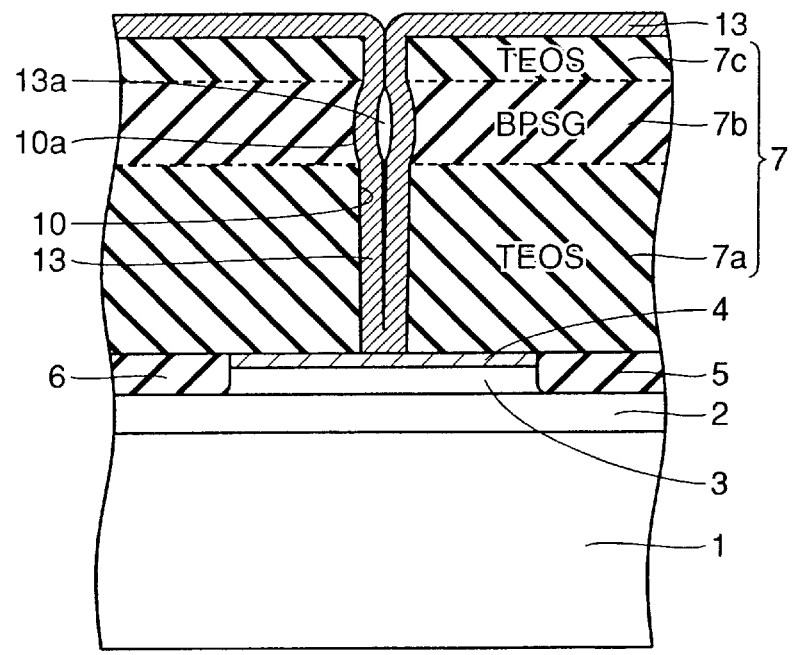
FIG. 15 is a cross section view showing the step carried out after the step as shown in FIG. 14.
Figure 16:
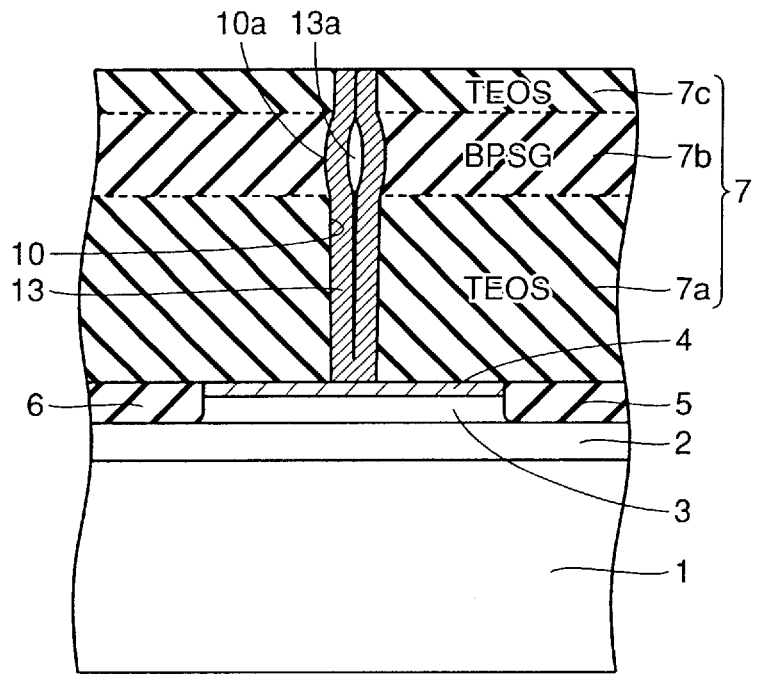
FIG. 16 is a cross section view showing the step carried out after the step as shown in FIG. 15.
Figure 17:
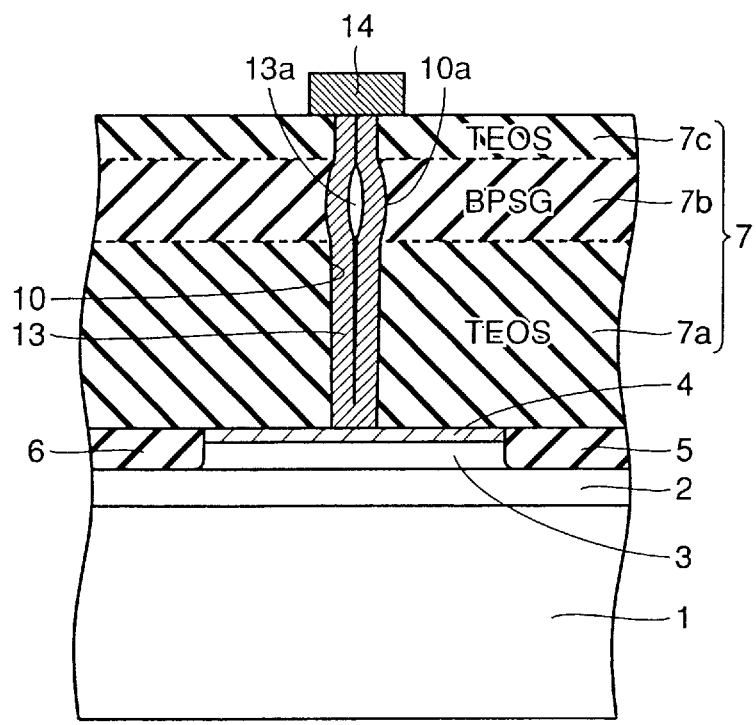
FIG. 17 is a cross section view showing the step carried out after the step as shown in FIG. 16.
Figure 18:
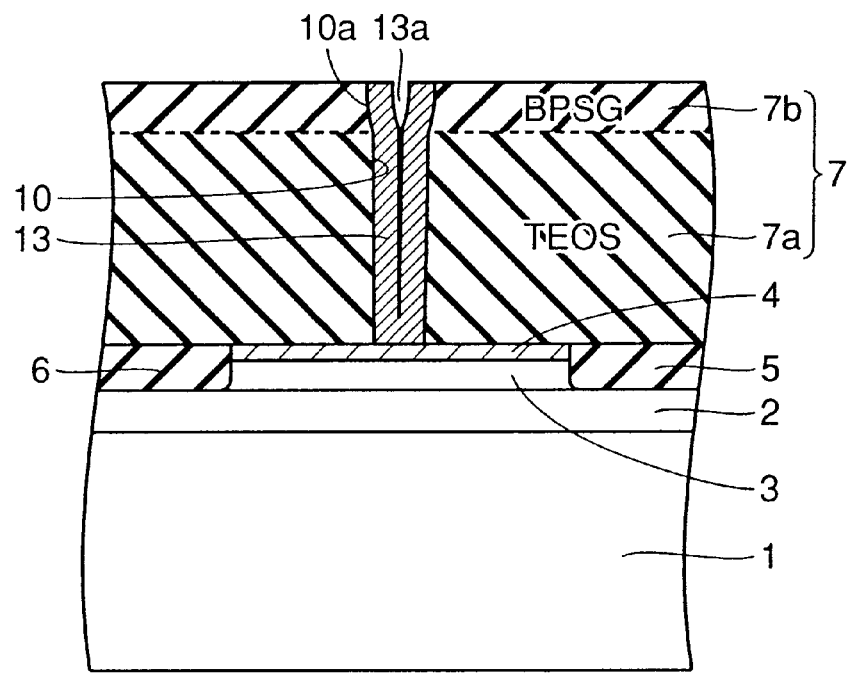
FIG. 18 is a cross section view showing the first problem with a method of manufacturing a semiconductor device according to a prior art.
Figure 19:
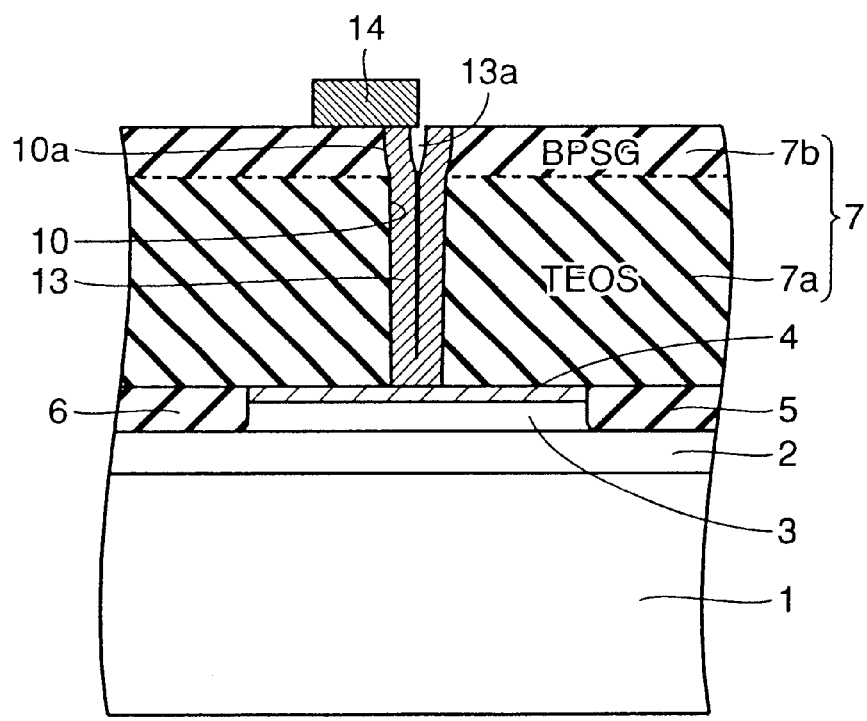
FIG. 19 is a cross section view showing the second problem with a method of manufacturing a semiconductor device according to a prior art.

By heating the second interlayer insulation layer 7b using BPSG, which is rich in heat fluidity, as shown in FIG. 13, the corners of the aperture part of the contact hole 10 are rounded off so as to form a cone shape 10b in the same way as in the second embodiment.

Operation and Working Effect

According to a method of manufacturing and a wiring structure based on this embodiment, the same operation and working effect as in the above described the first embodiment can be gained and it also becomes possible to improve the coverage of the contact wiring plug 13 for the contact hole 10 and to control the peeling of the contact wiring plug 13 by making the aperture part of the contact hole 10 into a cone shape 10b. In addition, it becomes possible to increase the reliability of the wiring structure of a DRAM by expanding the contact area with the wiring layer 14 of the contact wiring plug 13.

Here, though in each of the above described embodiments the case of a three layered structure is described with respect to the interlayer insulation layer, it is possible to apply the above described method of manufacturing in the same way to the case where a recessed region is formed in the middle area of the contact hole in an interlayer insulation layer of a one layered structure. In addition, the same can be said for the case of an interlayer insulation layer structure of three layers or more.

Moreover, though in each of the above described embodiments, a wiring structure used for a DRAM is described as one embodiment of a method of manufacturing a semiconductor, the invention is not limited to this.

In a semiconductor device according to this invention and in a method of manufacturing thereof, the contact wiring plug is formed to be filled in completely inside of the contact hole and, therefore, no hollow area is formed in the wiring plug as in a conventional structure. As a result, no slurry pool is generated at the time of CMP and no etching wet liquid pool is generated in the case that the second wiring region is formed in a shifted position and, therefore, it becomes possible to increase the reliability of the wiring structure of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising:

forming a first conductive region;

forming an interlayer insulation layer on said first conductive region;

opening a contact hole which has a recessed region wherein the side walls are recessed in the middle area and which pierces through said interlayer insulation layer and reaches said first conductive region;

forming a resist film within said contact hole and on the upper surface of said interlayer insulation layer;

exposing the recessed region for removing said resist film and part of said interlayer insulation layer located on the upper surface of said interlayer insulation layer so that said recessed region within said contact hole is exposed;

removing the resist film of which the residue remains within said contact hole;

forming a wiring plug within said contact hole; and forming a second wiring region connected to said wiring plug on the upper surface of said interlayer insulation layer.

2. The method of manufacturing a semiconductor device according to claim 1, wherein exposing the recessed region includes, after removing said resist film and part of said interlayer insulation layer located on the upper surface of said interlayer insulation layer;

removing the upper surface of said resist film, of which the residue remains within said contact hole, so as to be lower by a predetermined distance that the upper surface of said interlayer insulation layer; and removing the corner parts of said interlayer insulation layer which forms an aperture part of said exposed contact hole.

3. The method of manufacturing a semiconductor device according to claim 2, wherein removing the resist film includes applying heat processing to said interlayer insulation layer in order to round off the corner parts of said interlayer insulation layer, which form an aperture part of said exposed contact hole, after the residue of said resist film, which has remained within said contact hole, is removed.

4. The method of manufacturing a semiconductor device according to claim 1, wherein forming said interlayer insulation layer comprises:

forming a first interlayer insulation layer on said first conductive region;

forming a second interlayer insulation layer, of which the etching characteristic is different from that of said first interlayer insulation layer, on said first interlayer insulation layer; and forming a third interlayer insulation layer, which has the same etching characteristic as said first insulation interlayer layer, on said second interlayer insulation layer, said forming the first interlayer insulation layer and said forming the third interlayer insulation layer include forming a TEOS film, said forming the second interlayer insulation layer includes forming a BPSG film, and said recessed region is formed in said second interlayer insulation layer.

* * * * *